United States Patent
Dardona et al.

(10) Patent No.: US 10,867,914 B2
(45) Date of Patent: Dec. 15, 2020

(54) PRINTED EXTENDABLE SENSOR SYSTEM

(71) Applicant: United Technologies Corporation, Farmington, CT (US)

(72) Inventors: Sameh Dardona, South Windsor, CT (US); Dustin D. Caldwell, Portland, CT (US); Callum Bailey, Glastonbury, CT (US)

(73) Assignee: United Technologies Corporation, Farmington, CT (US)

( * ) Notice: Subject to any disclaimer, the term of this patent is extended or adjusted under 35 U.S.C. 154(b) by 0 days.

(21) Appl. No.: 16/299,502

(22) Filed: Mar. 12, 2019

(65) Prior Publication Data

US 2020/0294907 A1    Sep. 17, 2020

(51) Int. Cl.
  *H01L 23/528* (2006.01)
  *H01L 21/768* (2006.01)
(52) U.S. Cl.
  CPC ...... *H01L 23/528* (2013.01); *H01L 21/76895* (2013.01)
(58) Field of Classification Search
  CPC .................. H01L 23/528; H01L 21/76895
  USPC .................................................. 257/773
  See application file for complete search history.

(56) References Cited

U.S. PATENT DOCUMENTS

| | | |
|---|---|---|
| 10,012,552 B2 | 7/2018 | Batzinger et al. |
| 2002/0094701 A1 | 7/2002 | Biegelsen et al. |
| 2011/0118990 A1 | 5/2011 | Sidhu et al. |
| 2015/0065840 A1 | 3/2015 | Bailey |
| 2015/0143601 A1* | 5/2015 | Longinotti-Buitoni ...... A61B 5/0022 2/69 |
| 2016/0290880 A1 | 10/2016 | Lewis et al. |
| 2017/0106585 A1 | 4/2017 | Nino et al. |
| 2017/0213648 A1 | 7/2017 | Joyce et al. |
| 2017/0325724 A1 | 11/2017 | Wang et al. |
| 2018/0061743 A1 | 3/2018 | Hsu et al. |
| 2018/0175158 A1 | 6/2018 | Rogers et al. |

FOREIGN PATENT DOCUMENTS

WO    2016100218 A1    6/2016

OTHER PUBLICATIONS

Jason Trelewicz, Ph.D., MesoPlasma Direct Write Fabrication of Conformal, Harsh Environment Sensors,Passive Wireless Sensor Tag Workshop, Jul. 27-28, 2011, Houston, TX, 20 pages.

(Continued)

*Primary Examiner* — Tu-Tu V Ho
(74) *Attorney, Agent, or Firm* — Kinney & Lange, P.A.

(57) ABSTRACT

An extendable sensor system having a lattice topology includes a number of extendable interconnects having one or more electrically-conductive layers alternately sandwiched between two or more dielectric layers, two or more interconnect nodes, each located on the lattice topology and electrically-connected to the extendable interconnects to define a sensor array topology, and one or more sensors. The extendable interconnects are arranged in a serpentine pattern that is configured to be expanded, thereby extending the extendable sensor system. The expanded interconnects define an extended sensor system topology, and is configured to be installed on the surface of an asset. Methods of manufacturing an extendable sensor system are also disclosed.

20 Claims, 7 Drawing Sheets

(56) References Cited

OTHER PUBLICATIONS

Extended European Search Report dated Aug. 6, 2020, received for corresponding European Application No. 20151298.5, 12 pages.
Xiaowei Yu, Bikram K. Mahajan, Wan Shou and Heng Pan, Materials, Mechanics, and Patterning Techniques for Elastomer-Based Stretchable Conductors, Department of Mechanical and Aerospace Engineering, Missouri University of Science and Technology, Dec. 27, 2016, 29 pages.

* cited by examiner

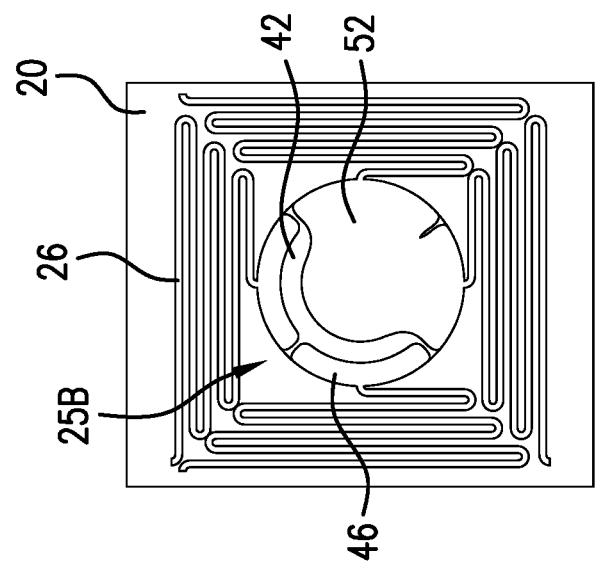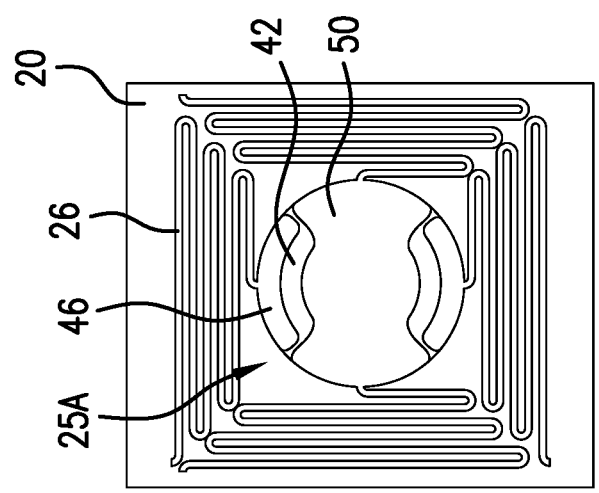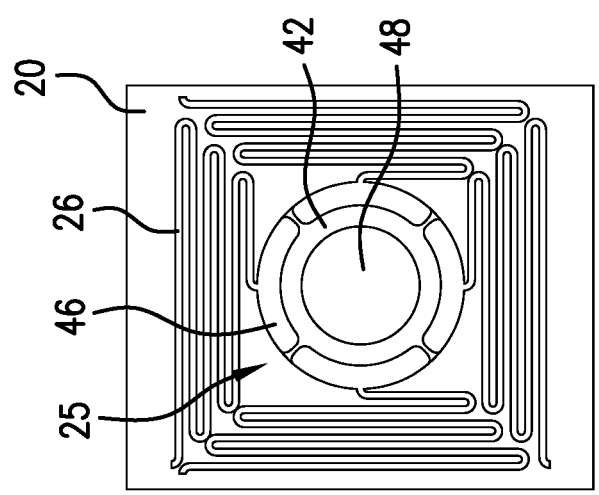

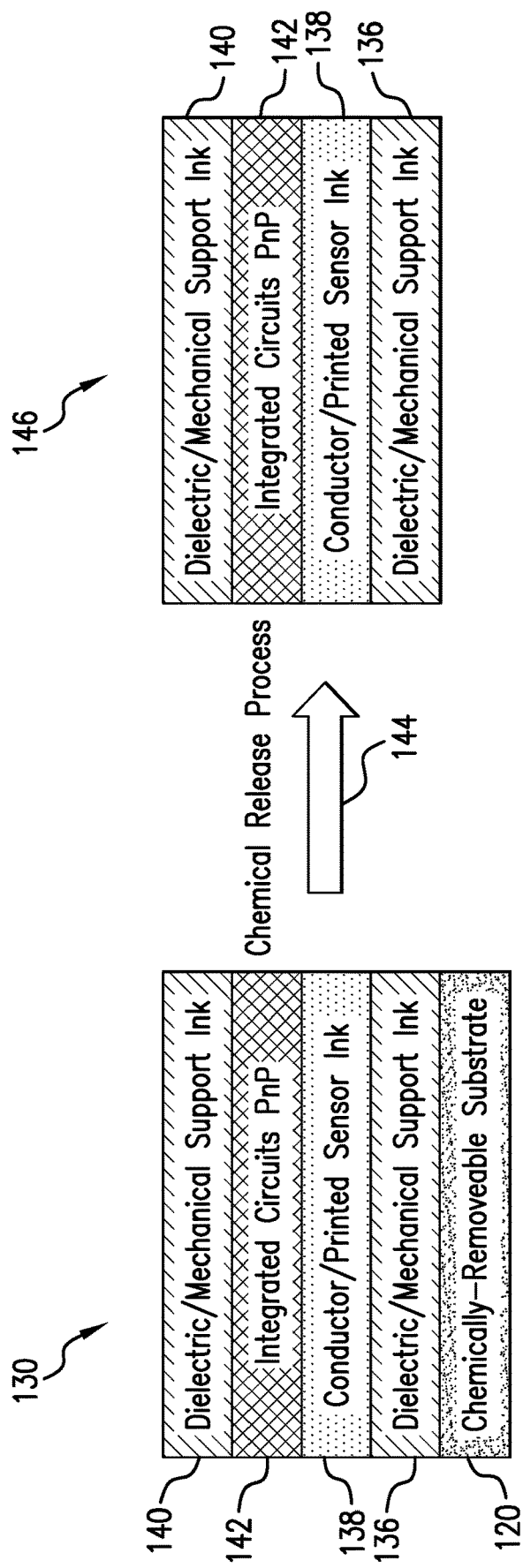
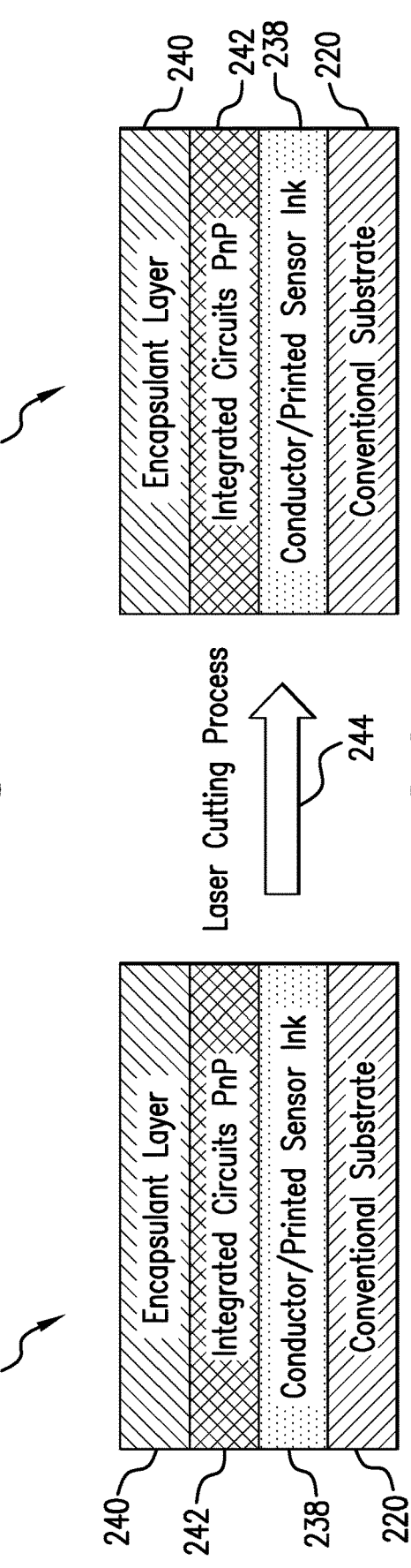
FIG.7
FIG.8

PRINTED EXTENDABLE SENSOR SYSTEM

STATEMENT OF GOVERNMENT INTEREST

This invention was made with Government support under Contract No.: FA8650-15-2-5401, awarded by the Department of the Air Force. The Government has certain rights in the invention.

CROSS-REFERENCE TO RELATED APPLICATION(S)

This application is related to U.S. patent application Ser. No. 16/266,837, entitled "LARGE STRUCTURE MONITORING WITH A SUBSTRATE-FREE FLEXIBLE SENSOR SYSTEM", filed Feb. 4, 2019.

BACKGROUND

Asset monitoring is a critical safety and cost saving factor for a wide variety of aerospace, commercial, and infrastructure assets, with examples including aircraft components, bridges, and automotive vehicles. The monitoring of parameters on an asset can be helpful in monitoring the lifecycle of that asset, including the detection of asset failure, or the detection of parameters that can lead to failure. Typically, a sensor that monitors a particular parameter at a particular point on an asset is mounted on or embedded in the surface of the asset. Additionally, electrical interconnects and associated circuitry are also generally required for asset monitoring. Individual sensors that are mounted on or near the surface of an asset can be helpful in the monitoring of that asset. However, it can be preferable to have a greater number of sensors across an asset's surface to allow for a greater density of monitored parameters. In some applications, a substrate containing sensors and interconnect circuitry can be applied to the monitored surface of an asset. Generally, the accompanying increase in size and/or weight of the asset monitoring system can have an adverse effect on the structural properties of the monitored surface, and/or the performance of the asset.

As the surface area density of monitoring points on an asset increases, the associated size and/or weight of the electrical interconnects and the associated circuitry for those sensors also increases. Moreover, as the monitored surface area of an asset increases, so too can the difficulty in fabricating the large network of sensors. Manufacturing limitations can affect the ability to fabricate a sensor network for assets having a larger monitored surface area. A need exists for an extendable, flexible, substrate-free sensor system that is capable of being fabricated in a nominal form factor and then extended for conformal installation on a surface of a larger form factor asset, while minimally adding size and weight to the asset.

SUMMARY

An extendable sensor system having a lattice topology includes a number of extendable interconnects having one or more electrically-conductive layers alternately sandwiched between two or more dielectric layers, two or more interconnect nodes, each located on the lattice topology and electrically-connected to the extendable interconnects to define a sensor array topology, and one or more sensors. The extendable interconnects are configured to provide electrical connections to a sensor array. At least some of the extendable interconnects are arranged in a serpentine pattern that is configured to be expanded, thereby extending the extendable sensor system. The extended extendable sensor system defines an extended sensor system topology, and the extended sensor system topology is configured to be installed on the surface of an asset.

A method of manufacturing a substrate-free extendable sensor system includes additively manufacturing on a sacrificial substrate the extendable sensor system by performing the steps of: (a) depositing a first dielectric layer that includes a curable material, thereby defining a lattice topology, (b) depositing an electrically-conductive that is configured to provide electrical connections to a sensor array over the first dielectric layer, thereby defining a pattern of interconnects, (c) depositing one or more sensors on the lattice topology, each located at a point defined by an intersection of interconnects and electrically connected to the electrical connections, (d) depositing a second dielectric layer over the electrically-conductive layer, and (e) performing a release process, thereby releasing the extendable sensor system from the sacrificial substrate. The pattern of interconnects includes a number of extendable interconnects, at least some of which are arranged in a serpentine pattern that is configured to be expanded, thereby extending the extendable sensor system. The extended extendable sensor system defines an extended sensor system topology that is configured to be installed on the surface of an asset.

A method of manufacturing a substrate-free extendable sensor system includes additively manufacturing on a substrate the extendable sensor system by performing the steps of: (a) depositing an electrically-conductive layer that is configured to provide electrical connections to a sensor array over the first dielectric layer, thereby defining a lattice topology and the pattern of interconnects, (b) depositing one or more sensors on the lattice topology, each located at a point defined by an intersection of interconnects and electrically connected to the electrical connections, (c) depositing a dielectric layer over the electrically-conductive layer, and (d) performing a cutting process by precision machining using a femtosecond laser, thereby cutting the extendable sensor system from the substrate. The pattern of interconnects includes a number of extendable interconnects, at least some of which are arranged in a serpentine pattern that is configured to be expanded, thereby extending the extendable sensor system. The extended extendable sensor system defines an extended sensor system topology that is configured to be installed on the surface of an asset.

BRIEF DESCRIPTION OF THE DRAWINGS

FIG. 5A is a schematic top view of a sensor node.

FIG. 5B is a schematic top view of a second embodiment of a sensor node.

FIG. 5C is a schematic top view of a third embodiment of a sensor node.

FIG. 7 is a schematic cross-sectional side view of the extendable sensor system before and after the chemical release process.

FIG. 8 is a schematic cross-sectional side view of a third embodiment of the extendable sensor system before and after a laser cutting process.

DETAILED DESCRIPTION

Flexible Hybrid Electronic (FHE) based design and fabrication enables integration of a large number of sensors into assets to render them intelligent, while minimizing added weight and having no adverse effect on structural properties or function. In aerospace platforms, for example, many incidents are due to structural fatigue and impact damage. Use of newer, lightweight materials, including composites, introduces new failure mechanisms, such as delamination, to aircraft and automotive structures that require additional vigilance with respect to structural integrity.

Sensor nodes and extendable wiring, defined into a lattice topology, are printed on a thin sacrificial substrate and encapsulated using large screen printing or roll-to-roll (R2R) methods. The sensor system lattice is subsequently released from the thin substrate using pulsed femtosecond laser or chemical dissolution. Flexible and extendable interconnects between nodes, which transmit power and/or signals, are compliant when bonded to a curved surface. During the extension of the lattice network, a serpentine-pattern allows the lattice network to expand 20× or more in a linear dimension, thereby allowing a large-area network to be manufactured using existing equipment. Non-limiting examples of surfaces that can accommodate large-area networks include airplane wings and fuselages.

Figure 1:
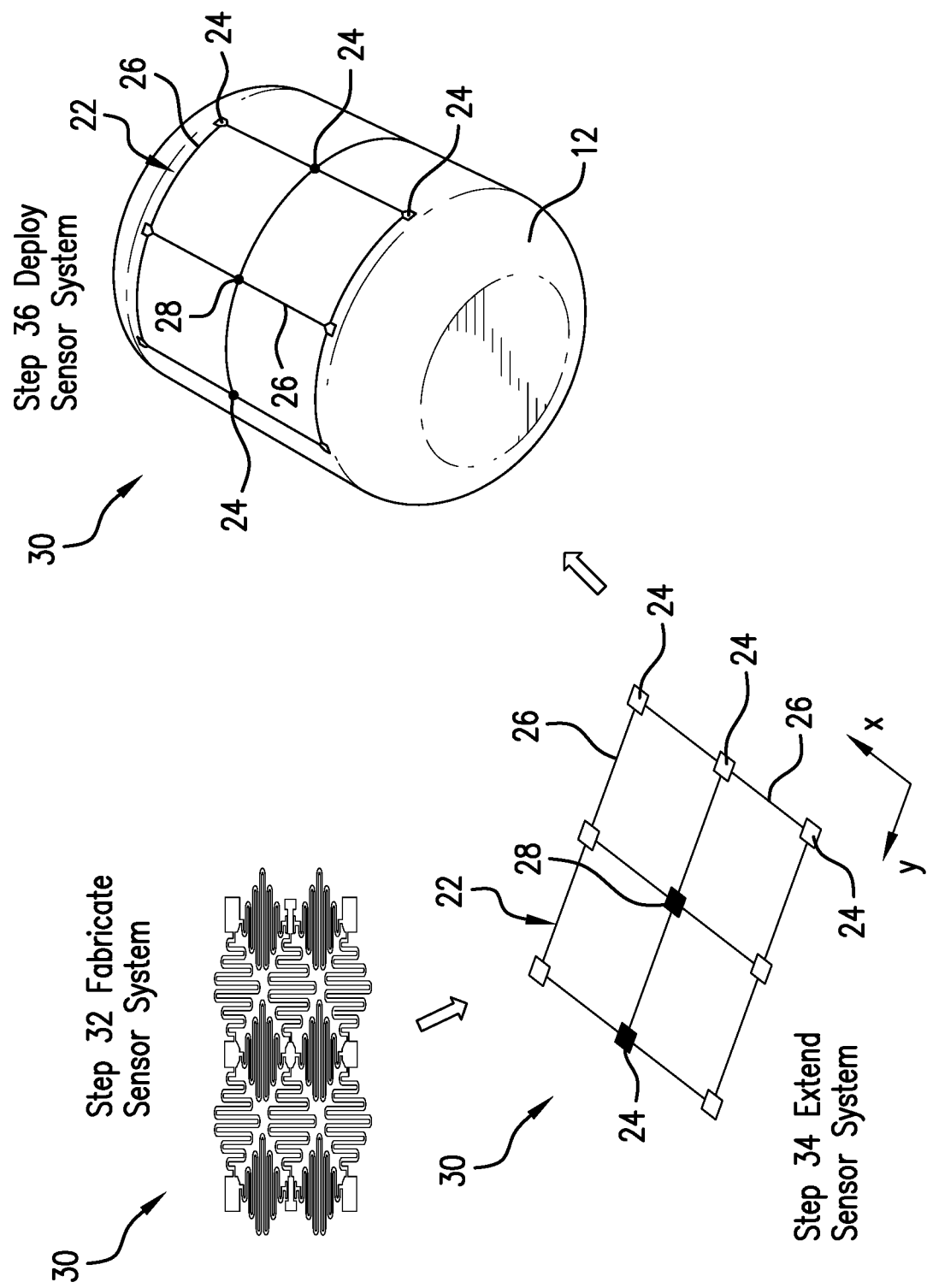
FIG. 1 is a process flow diagram showing steps in extending and deploying an extendable sensor system.

FIG. 1 is a process flow diagram showing steps in extending and deploying an extendable sensor system. Shown in FIG. 1 are monitored asset 12, electrical network 22, contact pads 24, interconnects 26, sensor 28, sensor system 30, fabricate sensor system step 32, extended sensor system step 34, and deploy sensor system step 36. In the illustrated embodiment, monitored asset 12 is a nacelle on an aircraft. Sensor system 30 can also be referred to as an extendable sensor system because it can be extended in two dimensions (i.e., planar extension) to be deployed on the surface of asset 12, thereby having an extended surface area that is greater than its fabricated surface area. Sensor system 30 includes electrical network 22, contact pads 24, and sensor 28. Electrical network 22 includes interconnects 26 arranged in a lattice network, with interconnects 26 providing electrical connections between contact pads 24 and sensor 28. Sensor 28 is mechanically and electrically connected to an underlying sensor node (not shown in FIG. 1). Contact pads 24 and sensor 28 can also be referred to as interconnect nodes, because they provide interconnections throughout electrical network 22. In the illustrated embodiment, sensor system 30 is fabricated in fabricate sensor system step 32 using an additive manufacturing process. Next, sensor system 30 is extended in two dimensions in extended sensor system step 34.

The arrangement of interconnects 26 in electrical network 22 allows for a planar extension (i.e., expansion in two dimensions), as shown in FIG. 1. Electrical network 22, and accordingly, interconnects 26, can be described as having appreciable stretchability. The serpentine pattern of interconnects 26 allows each particular interconnect 26 to be stretched, thereby allowing the sensor system 30 to be extended. In the illustrated embodiment, any particular interconnect 26 can be stretched in a linear dimension (i.e., an internodal distance) by a factor of approximately 10 from the fabricated state to the deployed state. This can also be referred to as a maximum expansion factor. Accordingly, sensor system 30 can undergo a linear expansion of up to approximately 10 in each of the x- and y-axis directions. Therefore, sensor system 30 can cover a surface area on monitored asset 12 that is approximately 100 times the surface area of sensor system 30 as produced in fabricate sensor system step 32. In some embodiments, sensor system 30 can have an asymmetrical planar expansion ability, meaning that the maximum expansion factor in one planar dimension (e.g., along the x-axis) can be either greater than or less than the maximum expansion factor in the other planar dimension (e.g., along the y-axis). In other embodiments, the maximum expansion factor of particular interconnects 26 can be less than or greater than approximately 10. It is to be appreciated that the maximum expansion factor of sensor system 30 in a particular dimension (i.e., along the x- or y-axis) is determined by the maximum expansion factor of the particular interconnects 26. In other embodiments, the maximum expansion factor of sensor system 30 in a linear direction can range from about 10-20. In yet other embodiments, the maximum expansion factor of sensor system 30 in a linear direction can be greater than 20. There is no upper limit to the maximum expansion factor in a particular embodiment, and all values of the maximum expansion factor are therefore within the scope of the present disclosure. Extended sensor system step 34 will also be described in greater detail later, in FIG. 2. It is to be appreciated that the stretching of interconnects 26 in a linear dimension (i.e., an internodal distance) is a result primarily of the straightening of the serpentine pattern of the various interconnects 26. Whereas the materials that form interconnects 26 can allow some degree of elongation (i.e., stretchability) in some embodiments, the mechanical flexibility of interconnects 26 contributes to the intermodal expandability (i.e., the maximum expansion factor) by the straightening of interconnects 26.

The lattice structure of sensor system 30 depicted in FIG. 1 can be described as having a rectangular structure (i.e., net-like). Accordingly, interconnects 26 can be generally referred to as being approximately oriented in either an x- or y-axis orientation, with respect to the coordinate axes depicted in FIG. 1. It is to be appreciated that the x- and y-axes are depicted arbitrarily, for the sake of description, and that in a particular embodiment, sensor system 30 can be oriented in any specific orientation.

Interconnects 26 provide electrical conductivity throughout electrical network 22. As will be described later in FIG. 4B, each interconnect 26 can include a flexible electrically-conductive trace (i.e., strand) that is sandwiched between flexible dielectric material (not shown in FIG. 1). In some embodiments, two or more electrically-conductive strands can be included in one or more interconnects 26. In some of these embodiments, the two or more electrically-conductive strands can be parallel to each other in the same layer, with an electrically-insulating region separating them. In other of these embodiments, the two or more electrically-conductive strands can be stacked one upon the other, with an electrically-insulating dielectric layer separating them. In yet other of these embodiments, some of the multiple electrically-conductive strands can be parallel to each other, and/or others of the multiple electrically-conductive strands can be stacked upon each other in separate layers, as described above.

Referring again to FIG. 1, after performing extend sensor system step 34, the x-axis-oriented interconnects 26 intersect the y-axis-oriented interconnects 26 at approximately right angles. The series of interconnects 26 (i.e., electrical network 22) is joined at contact pads 24 and/or at sensor 28 at each intersection, the details of which will be described more fully in FIGS. 3, 4A-4B, and 5A-5C. Each intersection of interconnects 26 can also be referred to as a routing junction. The flexibility (i.e., mechanical flexibility) of interconnects 26 allow sensor system 30 to be deployed on the curved surface of monitored asset 12, as depicted in deploy sensor system step 36. In the illustrated embodiment, sensor system 30 conforms to the surface of monitored asset 12 having a radius of curvature primarily in one direction. In other embodiments, sensor system 30 can conform to an irregular surface profile because of the flexibility and stretchability of interconnects 26, whereby each particular interconnect 26 can stretch by a factor that can be different from that of any of the other interconnects 26.

In deploy sensor network step 36, sensor system 30 can be handled by contact pads 24. Accordingly, contact pads 24 can also be referred to as handling tabs, because in some embodiments contact pads 24 have adequate mechanical strength to support the weight of sensor system 30 during handling. In deploy sensor network step 36, the lattice network of sensor system 30 is positioned on the desired surface of monitored asset 12, and is then adhered by one or more processes. In one embodiment, sensor system 30 can be bonded to the surface of monitored asset 12 by use of a separate bonding agent (not shown). In another embodiment, sensor system 30 can be bonded to the surface of monitored asset 12 by activating an adhesive layer (not shown) on sensor system 30 and/or on monitored asset 12. In yet another embodiment, sensor system 30 can be embedded in or under the surface of monitored asset 12. In any of these embodiments, an overcoat (not shown) can be applied over sensor system 30 during or after deploy sensor system step 36. After sensor system 30 is deployed (i.e., installed) on monitored asset 12, sensor system 30 can be connected to external circuitry (not shown) by means of contact pads 24.

It is to be appreciated that FIG. 1 depicts exemplary sensor system 30 having a single sensor 28, thereby representing a relatively uncomplicated lattice structure. FIG. 1 is provided to illustrate and to help describe an exemplary embodiment of the present disclosure. In other embodiments, sensor system 30 can include a greater number of sensors 28, and a correspondingly larger electrical network 22. As will be described in greater detail later in FIG. 6, there is no upper bound to the complexity of the lattice structure of sensor system 30.

Figure 2:
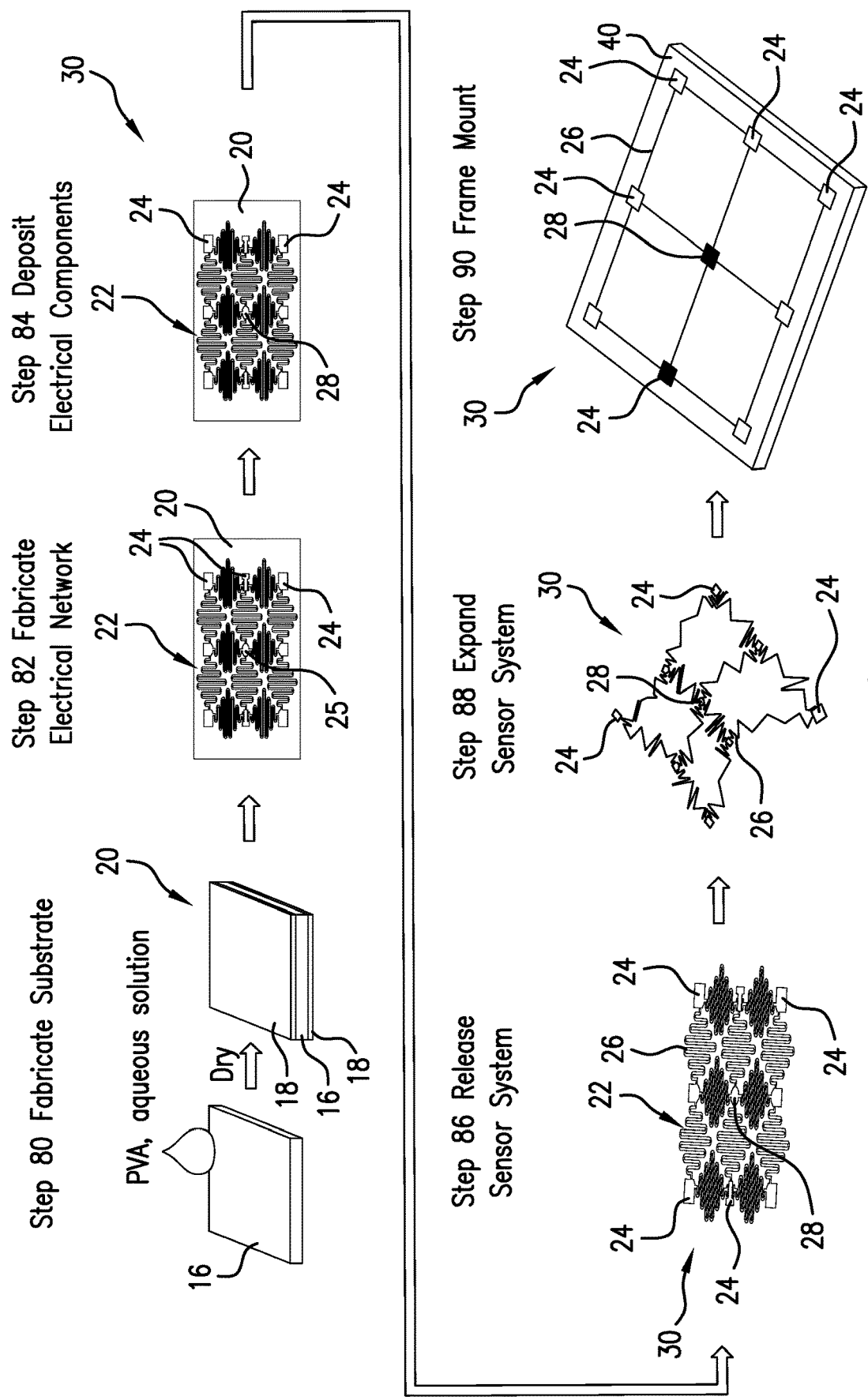
FIG. 2 is a process flow diagram showing steps in fabricating the extendable sensor system.

FIG. 2 is a process flow diagram showing steps in fabricating sensor system 30 (i.e., the extendable sensor system). Shown in FIG. 2 are polyethylene terephthalate (PET) sheet 16, polyvinyl alcohol (PVA) coating 18, chemically-removable substrate 20, electrical network 22, contact pads 24, sensor node 25, interconnects 26, sensor 28, sensor system 30, mounting frame 40, fabricate substrate step 80, fabricate electrical network step 82, deposit electrical components step 84, release sensor system step 86, expand sensor system step 88, and frame-mounting step 90.

In fabricate substrate step 80, PVA coating 18 is applied to both sides of PET sheet 16 and allowed to dry, thereby forming chemically-removable substrate 20. Chemically-removable substrate 20 can also be referred to as a sacrificial substrate because it is later sacrificed (i.e., removed) from sensor system 30. Next, in fabricate electrical network step 82, the structure of electrical network 22 is formed. As described above with regard to FIG. 1, electrical network 22 includes a series of contact pads 24, interconnects 26, and sensor node 25, whereby interconnects 26 are capable of flexing and stretching once released from chemically-removable substrate 20. The structure of electrical network 22 will be show in greater detail later, in FIG. 3. In the illustrated embodiment, chemically-removable substrate 20 includes PET sheet 16 as a base substrate, with a coating of PVA 18 on both sides. In some embodiments, chemically-removable substrate 20 can be made entirely or primarily of PVA. In other embodiments, chemically-removable substrate 20 can include PET sheet 16 having PVA coating 18 on a single side.

Referring again to FIG. 2, in fabricate electrical network step 82, electrical network 22 can be printed (i.e., additively-manufactured) on chemically-removable substrate 20. As used in this disclosure, "printing" is an additive-manufacturing process that can refer to any of a number of processes that can deposit material for fabricating a component or components. Chemically-removable substrate 20 can be a plate, sheet, or continuous roll of material, and can be thick or thin, and/or rigid or flexible. In a particular embodiment, chemically-removable substrate 20 can be a thin-film material on a roll, with fabricate electrical network step 82 using a roll-to-roll (R2R) manufacturing process. In another particular embodiment, chemically-removable substrate 20 can be a sheet of rigid or semi-rigid material, with fabricate electrical network step 82 using a large screen printing manufacturing process. Chemically-removable substrate 20 can later be removed from sensor system 30 by using a chemical dissolution process. In fabricate electrical network step 82 (i.e., print, additively manufacture), the lattice topology of interconnects 26, as well as contact pads 24 and the sensor node, can be delivered by one of several possible additive manufacturing and/or printing methods, with non-limiting examples including screen printing, R2R, gravure printing, ink jet printing aerosol jet (AJ) deposition, extrusion direct-write microdispensing, micro-cold spray deposition, thermal-spray deposition, and mesoplasma spray (i.e., miniaturized thermal spray). The structure of interconnects 26 will be described in more detail later, in FIG. 4B.

Next, in deposit electrical components step 84, sensor 28 is electrically and mechanically connected to sensor node 25, thereby providing electrical connection to electrical network 22. This establishes the proper electrical conduction paths necessary for sensor 28 to operate within sensor system 30. In the illustrated embodiment, sensor 28 can be an integrated circuit (IC) that is deposited onto electrical network 22 to create sensor system 30. In a particular embodiment, sensor 28 is a conventional monolithic semiconductor circuit package that is set onto electrical network 22 using a pick-and-place (PnP) manufacturing process, thereby providing a flexible hybrid electronic network. In other embodiments, sensor 28 can be an additively-manufactured sensor that is fabricated in place by using any of several processes that can be used to additively-manufacture (i.e., print) a sensor. Accordingly, as used in this disclosure, sensor 28 refers to any electronic device that can act as a sensor, transducer, and/or circuit, regardless of the method of manufacture or placement. Any particular sensor 28 can be a sensing element that is configured to provide an electrical signal in response to one or more sensed parameters. Non-limiting examples of sensed parameters include pressure, temperature, stress, strain, acceleration, vibration, acoustical energy (i.e., sound), and photonic energy (i.e., light). Any particular sensor 28 can be configured to respond to one or more parameters. In a particular embodiment, any particular sensor 28 can be configured to respond to a particular range of parameters. In some embodiments, any particular sensor 28 can provide an electrical signal in response to a sensed parameter without requiring an electrical supply. Sensors 28 can be any type of sensor, now known or later developed. Non-limiting examples of sensors that can be used for a particular sensor 28 can include thermocouples, resistance temperature detectors (RTDs), piezoelectric wafers, photocells, electrical resistance cells, electrical resistance bridges (e.g., Wheatstone bridge), electrical capacitance cells, and micro-electro-mechanical systems (MEMS) cells. Moreover, as used in this disclosure, depositing electrical components step 84 can be performed by a PnP manufacturing process and/or a printing (i.e., additive-manufacturing) process.

Next, in release sensor system step 86, sensor system 30 is released from chemically-removable substrate 20 by a dissolution process. In the illustrated embodiment, sensor system 30 being attached to chemically-removable substrate 20 is immersed in water, dissolving PVA coating 18, and thereby releasing sensor system 30 from chemically-removable substrate 20. In other embodiments, chemically-removable substrate 20 can be made of, or coated with (i.e., have a surface coating) any material that is chemically-dissolvable, thereby allowing the removal of chemically-removable substrate 20 from sensor system 30 by the use of a dissolvent. Non-limiting examples of chemical dissolvents include water, alcohol, limonene, and alkali solutions. Non-limiting examples of chemically-dissolvable (i.e., soluble) substrates include polyimide (e.g., KAPTON®), polyethylene terephthalate, and polycarbonate having a thin film soluble surface coating. Non-limiting examples of chemically-dissolvable (i.e., soluble) surface coatings include polyvinyl alcohol (e.g., water soluble), soluble acrylates (e.g., alkali soluble), and polystyrene (e.g., limonene soluble). In yet another embodiment, a sacrificial substrate that is not chemically-removable can be used, whereby mechanical removal can be used to remove the sacrificial substrate from sensor system 30 by any mechanical removal process. A non-limiting example of a mechanical removal process is using a laser to cut away a sacrificial substrate, for example, by the use of a pulsed femtosecond laser.

Referring again to FIG. 2, in expand sensor system step 88, sensor system 30 is now free of chemically-removable substrate 20, and is expanded in a plane (i.e., planar expansion, expansion in the x- and y-axis directions). During expand sensor system step 88, the structure of interconnects 26 is shown partially expanded as depicted in FIG. 2. In the illustrated embodiment, the structure of interconnects 26 can be referred to as a serpentine pattern of interconnects 26. The structure of interconnects 26 can also be referred to as a zig-zag pattern, or switch-backs, folds, S-curves, and the like. Contact pads 24 (i.e., handling tabs) can be used to expand sensor system 30 by being pulling outward (i.e., away from a central region of sensor system 30). As described above in regard to FIG. 1, contact pads 24 can also function as handling tabs, thereby having adequate mechanical strength to be used in expand sensor system step 88. In some embodiments, precision tooling can be used to pull outward on the various interconnects 26, contact pads 24, and/or sensor 28, thereby assisting in the planar expansion of sensor system 30. In the embodiment shown in FIG. 2, sensor system 30 is a 3×3 lattice network (i.e., three segments in each of the x- and y-axis dimensions) of interconnects 26. In some embodiments, a larger lattice network can be used for sensor system 30. For example, in a particular embodiment, a 7×13 lattice network can be used for sensor system 30. In some embodiments, sensor system can have a lattice network that exceeds 20 segments in either or both of the x- and y-axis directions. All lattice network configurations are within the scope of the present disclosure, regardless of the number of segments in either direction. Accordingly, it is to be appreciated that in some of these other embodiments, expand sensor system step 88 can include using precision tooling, and/or other methods, at various points and/or throughout various regions of sensor system 30.

In the illustrated embodiment, expand sensor system step 88 involves fully expanding, or substantially fully expanding, sensor system 30. In some embodiments, sensor system can be only partially expanded. For example, sensor system 30 can be partially expanded prior to being deployed on monitored asset 12 having an irregular surface profile, thereby allowing portions of sensor system 30 to more fully expand while conforming to an irregular surface profile of monitored asset 12. In other embodiments, release sensor system step 86 can be performed by physically removing PVA coating 18 from chemically-removable substrate 20, and sensor system 30 can be deployed on a surface of monitored asset 12 in an un-expanded condition (i.e., prior to expand sensor system step 88). In these other embodiments, sensor system 30 can be expanded in-situ on the surface of monitored asset 12, for example, by spraying sensor system 30 with water mist and allowing sensor system 30 to expand in-situ on the surface of monitored asset 12. Accordingly, in some of these other embodiments, the order of performing some process steps can be changed within the scope of the present disclosure.

Referring again to FIG. 2, sensor system 30 is placed on mounting frame 40 in frame-mounting step 90, which can be a temporary storage condition prior to installing sensor system 30 on monitored asset 12. In some embodiments, sensor system 30 can be stored using other storage method steps, with non-limiting examples including lying flat, hanging, and rolling around a roller or drum. In other embodiments, frame-mounting step 90 can be omitted, and sensor system 30 can be installed immediately on an asset (e.g., as shown above in regard to FIG. 1). Accordingly, in some embodiments, frame-mounting step 90 can be optional. It is to be appreciated that in most embodiments, frame-mounting step 90 is to provide for the temporary storage and/or transport of sensor system 30 prior to the step of deploying sensor system 30 on an asset (not shown in FIG. 2).

Figure 3:
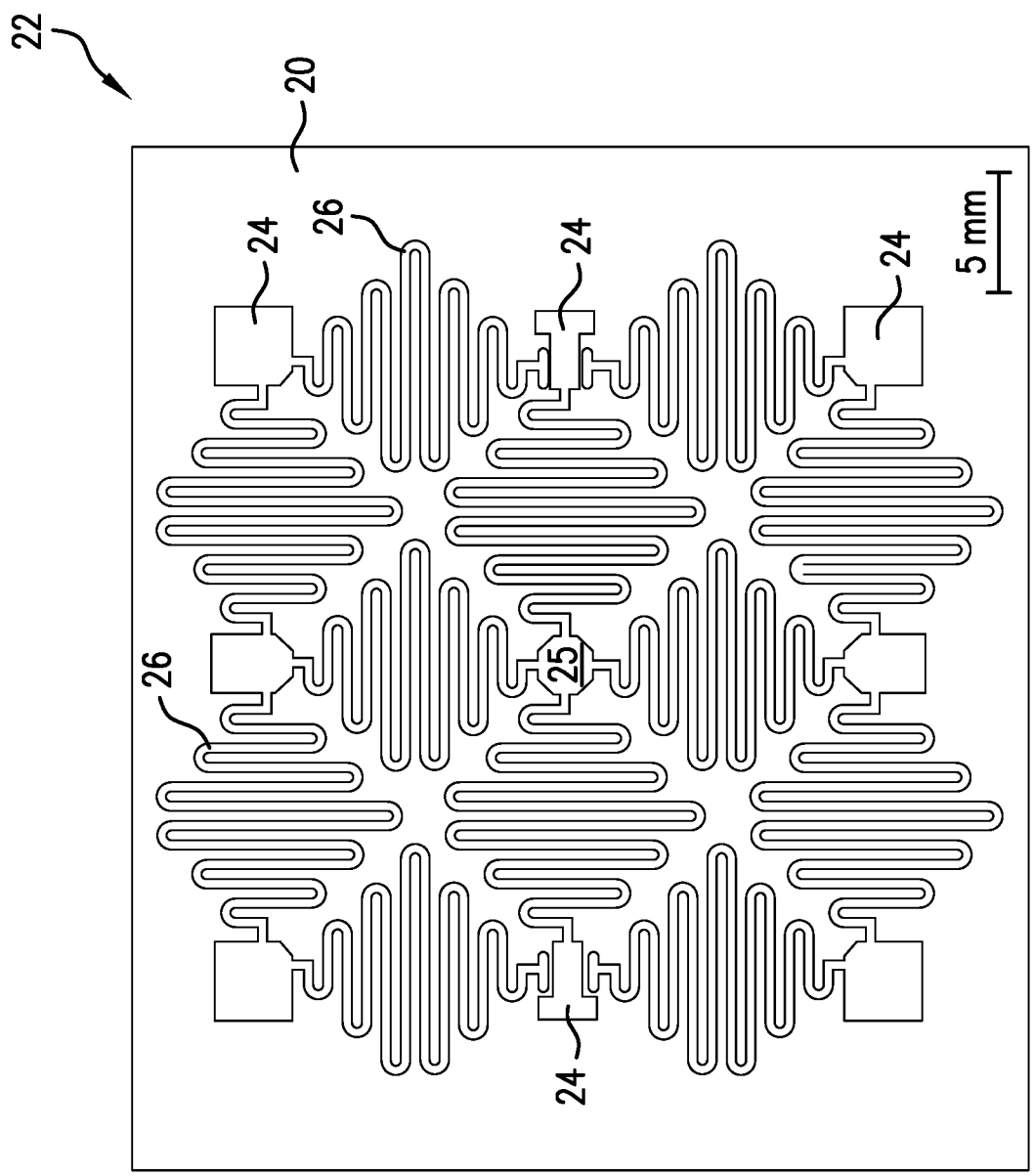
FIG. 3 is a top view showing the electrical network of the extendable sensor system shown in FIG. 2.

FIG. 3 is a top view showing electrical network 22 of sensor system 30 shown in FIG. 2. It is to be appreciated that FIG. 3 depicts electrical network 22 following fabricate electrical network step 82 and prior to deposit electrical components step 84, as described above in regard to FIG. 2. Shown in FIG. 3 are chemically-removable substrate 20, electrical network 22, contact pads 24, sensor node 25, and interconnects 26. Contact pads 24 describe the various points that can be used for making an electrical connection to electrical network 22. In the illustrated embodiment, contact pads 24 surround the perimeter of electrical network 22, being located in the corners and along the edges between the corners. In some embodiments, either a greater or lesser number of contact pads 24 can be used on electrical network 22 than is illustrated in FIG. 3. In other embodiments, contact pads 24 can also be located within an interior region of electrical network 22 (i.e., not in the corners or around the perimeter). The serpentine pattern of each individual interconnect 26 is shown in FIG. 3. In the illustrated embodiment, contact pads 24 are between about 2-3 mm across (i.e., from one side to the other), as can be seen from the 5 mm scale mark in FIG. 3. In other embodiments, contact pads 24 can be smaller and/or larger than shown in FIG. 3. Referring again to FIG. 3, sensor node 25 is the point on electrical network 22 where sensor 28 (not shown in FIG. 3) will be located. Sensor node 25 will be described in more detail later, in FIGS. 5A-5C.

Figure 4B:
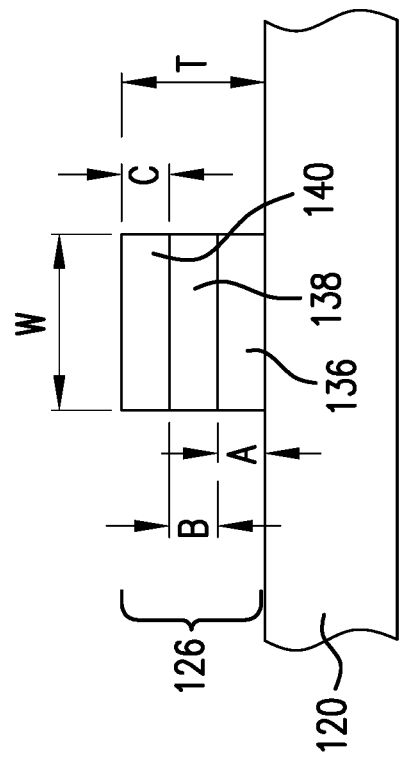
FIG. 4B is a schematic cross-sectional side view of an interconnect in the electrical network shown in FIG. 4A.
Figure 4A:
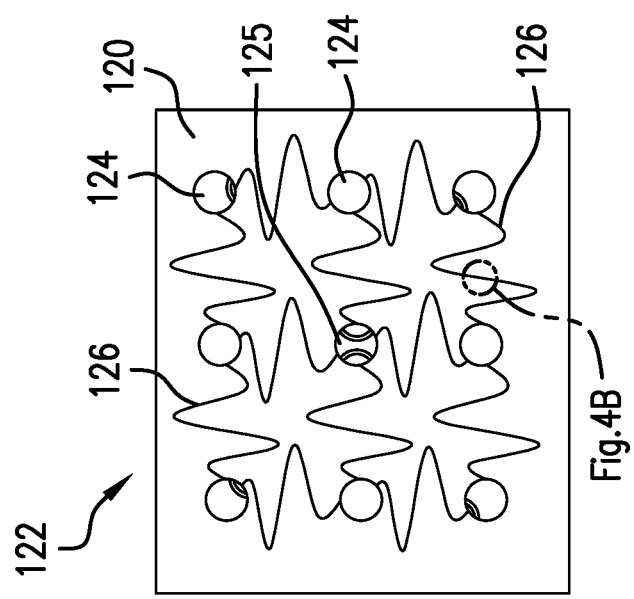
FIG. 4A is a top view of a second embodiment of the electrical network of an extendable sensor system.

FIG. 4A is a top view of a second embodiment of the electrical network of an extendable sensor system. Shown is FIG. 4A are chemically-removable substrate 120, electrical network 122, contact pads 124, sensor node 125, and interconnects 126. The descriptions of chemically-removable substrate 120, electrical network 122, contact pads 124, sensor node 125, and interconnects 126 are substantially similar to that provided above in regard to FIG. 2. It is to be appreciated that in the illustrated embodiment, the serpentine pattern of interconnects 126 involves fewer switchbacks than shown in the embodiment of FIGS. 1-3. Accordingly, the maximum expansion factor of electrical network 122 is about 2 (i.e., a smaller value than that described above in regard to FIG. 1).

FIG. 4B is a schematic cross-sectional side view of a particular interconnect 126 shown in FIG. 4A. Shown in FIG. 4B are chemically-removable substrate 120, interconnect 126, first dielectric layer 136, conductor layer 138, and second dielectric layer 140. First and second dielectric layers 136, 140 can be referred to as dielectric/mechanical support ink, and conductor layer 138 can be referred to as conductor/printed sensor ink. First dielectric layer 136 can also be referred to as a bottom dielectric layer, being in contact with chemically-removable substrate 120. Second dielectric layer 140 can also be referred to as a top dielectric layer. Also shown in FIG. 4B are interconnect width W, interconnect thickness T, first dielectric layer thickness A, conductor layer thickness B, and second dielectric layer thickness C. Interconnect 126 consists of conductor layer 138 sandwiched between first and second dielectric layers 136, 140, as shown in FIG. 4B. Interconnect 126 has interconnect width W and interconnect thickness T, with interconnect thickness T being the combination of first dielectric layer thickness A, conductor layer thickness B, and second dielectric layer thickness C. In the illustrated embodiment, interconnect width W is approximately 100 microns wide (i.e., 100 μm), and interconnect thickness T is approximately 65 microns thick (i.e., 65 μm). First dielectric layer thickness A and second dielectric layer thickness C are each about 20 microns thick, and conductor layer thickness B is about 25 microns thick. In some embodiments, interconnect width W can range between 50-500 microns. In other embodiments, interconnect width W can be less than 50 microns, or greater than 500 microns. In some embodiments, interconnect thickness T can range between 30-500 microns. In other embodiments, interconnect thickness T can be less than 30 microns, or greater than 500 microns. In some embodiments, first dielectric layer thickness A and second dielectric layer thickness C can be different from each other.

Referring again to FIG. 4B, an interconnect aspect ratio (W/T) can be defined as the ratio of interconnect width W to interconnect thickness T. In the illustrated embodiment, W/T is approximately 1.54 (i.e., 100 μm/65 μm). In some embodiments, W/T can range between 1.5-2.0. In other embodiments, W/T can range between 1.0-10. In yet other embodiments, W/T can be less than 1.0, meaning that interconnect thickness T is greater than interconnect with W. This can be beneficial, for example, for larger expansion factors of interconnect 126 (i.e., larger expansion factors of sensor system 30), whereby the serpentine pattern of electrical network 122 can be more dense. In some embodiments, a value of W/T<1.0 can be beneficial in reducing the tendency of interconnects 126 to curl out of the expansion plane. In other embodiments, it can be beneficial to have W/T in the range from about 0.4-2.5, which can help reduce the tendency of interconnects 122 to roll or curl out of the expansion plane. In yet other embodiments, W/T can be less than 0.4 or greater than 10. In some of these embodiments, other measures can be taken to reduce the tendency of interconnects 122 to roll or curl during the extension. In some embodiments, it can be tolerable to allow some or all of interconnects 122 to roll or curl during expansion.

Referring to FIGS. 4A-4B, first and second dielectric layers 136, 140 can be made from photoset and thermoset polymer dielectric inks, extruded thermoplastics, and the like. Conductor layer 138 can be made from conductive inks containing silver, copper, aluminum, gold, platinum, ruthenium, carbon, and/or alloys of these metals. In other embodiments, some or all conductor layers can be made from combinations of these metals, partial conductors, and/or composites. In the illustrated embodiment, electrical network 122 (i.e., interconnects 126) is printed (i.e., additively manufactured) on chemically-removable substrate 120 in three layers (i.e., first dielectric layer 136, conductor layer 138, and second dielectric layer 140). First dielectric layer 136 defines the lattice topology (i.e., structure), conductor layer 138 establishes the electrical conduction paths of interconnects 126 and other circuitry components, and second dielectric layer 140 provides encapsulation. Additional fabrication steps will be described in greater detail later in FIGS. 7-8. In the illustrated embodiment, the various printing inks (i.e., fluid materials) that form first dielectric layer 136, conductor layer 138, and second dielectric layer 140 can be made using a curable resin. In some embodiments, the curable resin can be a photopolymer (i.e., light-activated resin) that changes properties when exposed to light. A photopolymer that is optimized to respond to ultraviolet (UV) light is known as a UV-curable resin. The photopolymer can be comprised of monomers and/or oligomers, and photoinitiators, thereby allowing the printing inks to be soft and flowable in an uncured condition, then becoming sufficiently viscous or solid as a result of the cross-linking of the monomers and/or oligomers during the light-activating process. The process by which printing ink (e.g., photopolymer resin) becomes more viscous or solidifies is also known as curing. A photopolymer cures by the action of photoinitiators that absorb photon energy during exposure to light of a particular wavelength or range of wavelengths. As the printing ink (i.e., photopolymer resin) cures, it becomes sufficiently viscous or solid, while also bonding to any solid material that it is in contact with. In some embodiments, the printing ink can be selected to be responsive to ultraviolet light having a wavelength of about 100-425 nanometers (nm). In some of these embodiments, the printing ink can be selected to be responsive to ultraviolet light having wavelengths of about 365-405 nm. Ultraviolet light sources of about 365 nm and 405 nm wavelengths may be commercially available and readily adaptable to the process of the present disclosure. In some embodiments, the printing ink (i.e., photopolymer resin) can cure as a result to a broader range of wavelengths. In some of these embodiments, visible light can initiate the curing process (e.g., the shorter wavelengths of visible light near the violet end of the visible light spectrum). Accordingly, in some embodiments, special precautions may need to be taken to prevent the premature curing (i.e., viscofication or solidification) of the printing ink (i.e., photopolymer).

In other embodiments, the curable resin can be responsive to an elevated temperature for initiating the curing process. A material that is responsive to an elevated temperature for curing can also be referred to as a thermoset material. Higher temperatures may accelerate the curing rate of the printing ink, with a temperature of about 120° C. (248° F.) resulting in a noteworthy rate of curing. Temperatures ranging from about 55° C. (131° F.) to about 140° C. (284° F.) can be used to effectuate a noteworthy rate of curing the printing ink during fabricate step 104. In some embodiments, the curable resin can be a thermoplastic resin that solidifies (i.e., cures) by cooling. In other embodiments, the curable resin can be a thermally-cured ink that uses a thermal solvent for evaporation/sintering of the ink. In yet other embodiments, non-resin materials can be used for one or more of the various layers of a sensor system. As used in this disclosure, "curable material" describes any material that can undergo viscofication, hardening, and/or solidification during a fabrication process. Accordingly, both resins (i.e., photoresins, thermal-resins) and non-resins can be curable materials. Non-limiting examples of curable non-resins include thermoplastics, inks, metals, and/or other materials that can be deposited (i.e., printed) as powders, molten materials, liquids, and the like by one or more additive-manufacturing processes (e.g., cold spray, thermal spray, thermal solvent evaporation, sintering). It is to be appreciated that the various layers of interconnects 126 can be made of different curable materials, for example, as described above. Accordingly, in some embodiments the curable materials that are used for an electrically-conductive layer and a dielectric layer can be referred to as "first" and "second" curable materials, respectively. In some of these embodiments, the first and second curable materials can be similar to each other, or substantially the same as each other.

In some embodiments, conductor layer 138 can be an electrically-conductive layer that is fabricated by a direct material deposition process using a metal or alloy. Accordingly, in these embodiments, it is not necessary for conductor layer 138 to contain curable materials in addition to electrically-conductive materials. In the illustrated embodiment, fabricated sensor structure 130 has a single layer of conductor layer 138. In other embodiments, two or more layers of conductor layer 138 can be used, each being sandwiched between alternating layers of a dielectric layer, thereby providing two or more electrically-conductive strands in a particular interconnect 126 (e.g., as described above in regard to FIG. 1). Accordingly, in some of these other embodiments, a second, third, etc. conductor layer can be used, and a third, fourth, etc. dielectric layer can be used.

FIG. 5A is a schematic top view of a sensor node. FIG. 5B is a schematic top view of a second embodiment of a sensor node. FIG. 5C is a schematic top view of a second embodiment of a sensor node. Shown in FIGS. 5A-5C are chemically-removable substrate 20, interconnects 26, dielectric 42, sensor nodes 44, 44A, 44B, sensor edge contact 46, center bond pad 48, side conductor 50, and corner conductor 52. Chemically-removable substrate 20 and interconnects 26 are substantially similar to those described above in regard to FIG. 1. Sensor nodes 25, 25A, 25B depict exemplary electrical connections that can be provided to later attach a particular sensor (not shown in FIGS. 5A-5C) to interconnects 26. Dielectric 42 provides electrical isolation between sensor edge contact 46, center bond pad 48, side conductor 50, and/or corner conductor 52 in various embodiments. Sensor edge contact 46, center bond pad 48, side conductor 50, and corner conductor 52 can also be referred to as sensor connection pads, because they can be used to provide electrical connections to a particular sensor when so attached. Side conductor 50 and corner conductor 52 can also be referred to as routing junctions, because they provide electrical connections (i.e., routing) between interconnects 26. In some embodiments, routing junctions (i.e., side conductor 50, and corner conductor 52) can be used without an associated sensor. In embodiments where a sensor is attached to sensor node 25, 25A, 25B, the various sensor connection pads can also be used to provide a mechanical connection between that sensor and sensor nodes 25, 25A, 25B.

Referring to FIG. 5A, center bond pad 48 can be used to provide a mechanical connection (i.e., bonding) between sensor node 25 and a sensor if so attached. However, center bond pad 48 is not electrically connected to interconnects 26. In some embodiments, two or more electrically-conductive strands (i.e., layers) layers can be used in a particular interconnect 26, as was described above in regard to FIG. 1. In some of these embodiments, an electrical connection can be made between a particular interconnect 26 and center bond pad 48, thereby allowing an electrical connection to be made to a sensor attached thereon.

Referring to FIGS. 5B-5C, side conductor 50 can provide electrical connectivity between interconnects 26 that are positioned on opposite sides of sensor node 25A. In some embodiments, side conductor 50 can also provide an electrical connection to a sensor if so attached. Similarly, corner conductor 52 can provide electrical connectivity between interconnects 26 on a corner of sensor node 25B. In some embodiments, corner conductor 52 can also provide an electrical connection to a sensor if so attached. It is to be appreciated that other configurations of sensor connection pads beyond the exemplary embodiments shown in FIGS. 5A-5C. As a non-limiting example, a side-corner conductor (not shown in FIGS. 5A-5C) could be used to provide an electrical connection between three interconnects 26.

Figure 6:
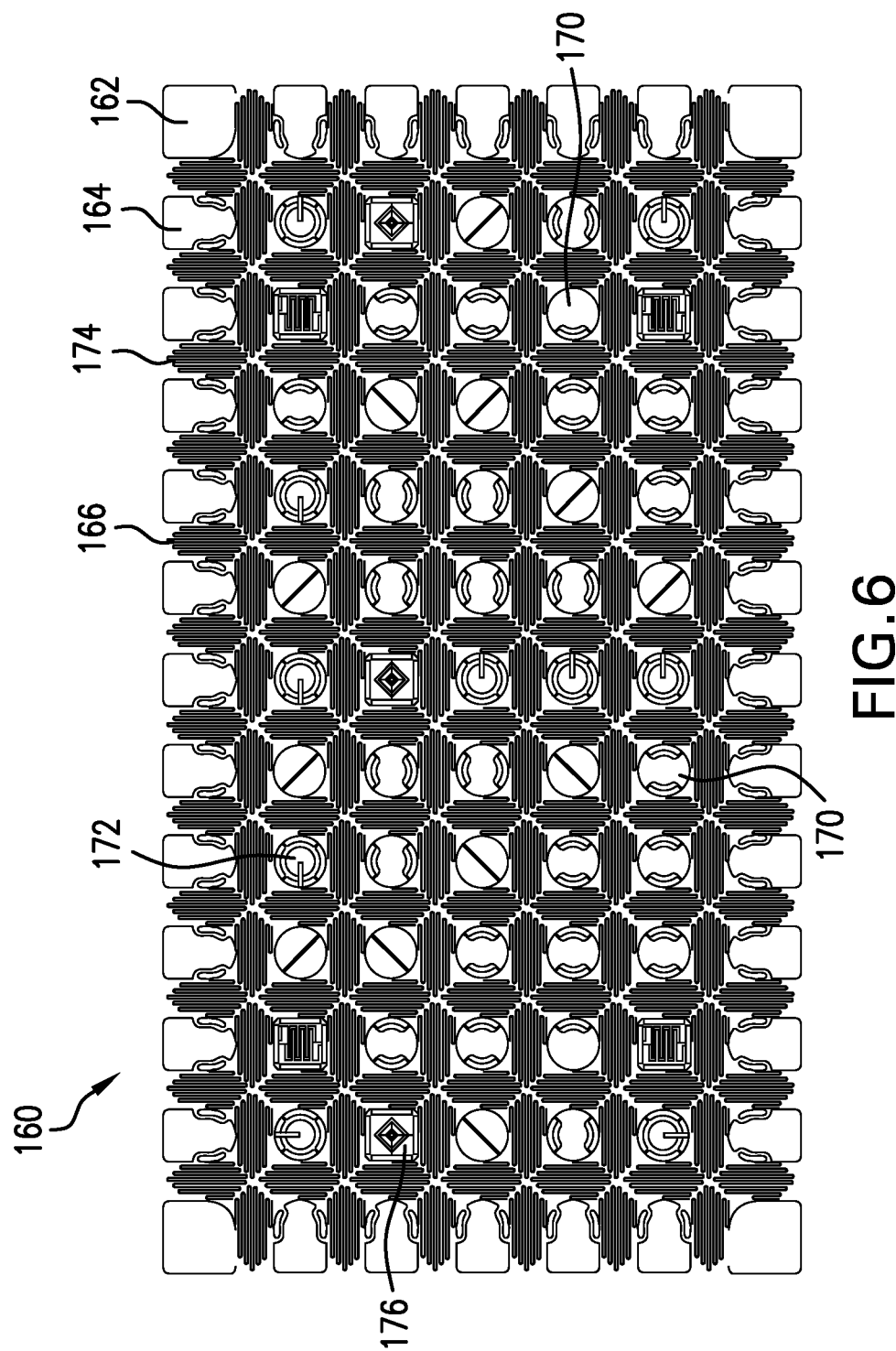
FIG. 6 is a schematic top view of a second embodiment of the extendable sensor system.

FIG. 6 is a schematic top view of a second embodiment of the extendable sensor system. Shown in FIG. 6 are sensor system 160, corner pads 162, contact pads 164, interconnects 166, routing junctions 170, piezoelectric wafers 172, resistance temperature detectors (RTDs) 174, and Wheatstone bridges 176. Corner pads 162, contact pads 164, and interconnects 166 are substantially similar to those described above in regard to FIG. 1, being greater in number than the embodiment illustrated in FIG. 1. The embodiment illustrated in FIG. 6 depicts a 13×7 lattice structure. Routing junctions 170 provide electrical connections between adjacent interconnects 166, and are substantially similar to those described above in regard to FIGS. 5A-5C. Routing junctions 170 can also be referred to as interconnect nodes. The illustrated embodiment shown in FIG. 6 includes three types of sensors, described as follows. Piezoelectric wafers 172 can be used as sensors to provide an indication of the structural health of a system. RTDs 174 can be used as sensors to provide an indication of a temperature at a point on a system. Wheatstone bridges 176 can be used as sensors to provide in indication of material strain in a system. In some embodiments, other types of sensors can be used in addition and/or in lieu of those shown in FIG. 6. Non-limiting examples of other types of sensors that can be used in sensor system include thermocouples, photocells, electrical resistance cells, electrical capacitance cells, and micro-electro-mechanical systems (MEMS) cells, as described above in regard to FIG. 2. Any type of sensor, now known or later developed, in sensor system 160 is within the scope of the present disclosure. The illustrated embodiment depicts exemplary electrical connections between corner pads 162, contact pads 164, interconnects 166, routing junctions 170, and the various sensors (e.g., piezoelectric wafers 172, RTDs 174, and Wheatstone bridges 176) in sensor system 160.

FIG. 7 is a schematic cross-sectional side view of sensor system 60 before and after a chemical release process. Shown in FIG. 7 are fabricated sensor structure 130, chemically-removable substrate 120, first dielectric layer 136 (i.e., dielectric/mechanical support ink), conductor layer 138 (i.e., conductor/printed sensor ink), second dielectric layer 140 (i.e., dielectric/mechanical support ink), integrated circuits 142, chemical release process 144, and sensor structure 146. Fabricated sensor structure 130 depicts a representative sensor (e.g., as described above in regard to FIG. 6). Chemically-removable substrate 120 is substantially similar to that described above in regard to FIG. 2. During the fabrication of fabricated sensor structure 130, various layers (i.e., first dielectric layer 136, conductor layer 138, second dielectric layer 140, integrated circuits 142) are deposited (e.g., printed, additively manufactured) using printing ink. It is to be appreciated that curing of the printing ink can occur following the printing of each of the various layers, with the curing (i.e., viscofication or solidification) of the printing ink (i.e., curable material) being either partial or complete. Those who are skilled in the art of additive manufacturing using curable materials (i.e., curable resins or non-resins) are familiar with the various methods that can be used to cure or to partially cure printed layers of a curable material.

Referring again to FIG. 7, first dielectric layer 136 is printed on to chemically-removable substrate 120. First dielectric layer 136 provides an electrical dielectric (i.e., insulating layer), while also providing mechanical support (i.e., structural integrity) for sensor system 60. Next, conductor layer 138 is printed over first dielectric layer 136. Conductor layer 138 can be electrically conductive, being formed of a mixture of metallic elements and curable materials. Examples of metallic elements include those described above in regard to FIG. 4B. Conductor layer 138 can be connected to associated interconnects (not shown in FIG. 7). Next, integrated circuits 142 are deposited onto conductor layer 138 while establishing the proper electrical conduction paths necessary for a particular integrated circuit 140 (i.e., a sensor) to operate. In the illustrated embodiment, integrated circuits 142 are conventional monolithic semiconductor circuit packages that are set onto conductor layer 138 using a pick-and-place (PnP) manufacturing process, thereby providing a flexible hybrid electronic network. Next, second dielectric layer 140 is printed over integrated circuits 142, thereby providing an electrical dielectric (i.e., insulating layer), while also providing mechanical support (i.e., structural integrity). In other embodiments, integrated circuits 142 can be additively-manufactured sensors that are manufactured in place by using any of several processes that can be used to additively-manufacture (i.e., print) a sensor. Accordingly, as used in this disclosure, integrated circuit 142 refers to any electronic device that can act as a sensor, transducer, and/or circuit. Moreover, as used in this disclosure, depositing integrated circuit 142 can be performed by a PnP manufacturing process and/or a printing (i.e., additive-manufacturing) process. In some embodiments, conductor layer 138 can be an electrically-conductive layer that is fabricated by a direct material deposition process using a metal or alloy, as described above in regard to FIGS. 4A-4B. Accordingly, in these embodiments, it is not necessary for conductor layer 138 to contain curable materials in addition to electrically-conductive materials. In the illustrated embodiment, fabricated sensor structure 130 has a single layer of conductor layer 138. In other embodiments, two or more layers of conductor/printed sensor ink 138 can be used, each being sandwiched between alternating layers of dielectric/mechanical support ink 136, thereby providing two or more electrically-conductive strands in a particular interconnect as described above in regard to FIG. 1. It is to be appreciated that the accompanying interconnects, routing junctions, handling tabs, and contact pads (not shown in FIG. 7) are fabricated concurrently with fabricated sensor structure 130.

Referring again to FIG. 7, chemical release process 144 is performed to separate fabricated sensor structure 130 from chemically-removable substrate 120. Accordingly, the accompanying interconnects, routing junctions, handling tabs, and contact pads (not shown in FIG. 7) are separated from chemically-removable substrate 120 concurrently during chemical release process 144. Therefore, the resulting fabricated sensor structure 130 can be referred to as a substrate-free manufactured extendable sensor system. In the illustrated embodiment, chemical release process 144 can be substantially similar to one of the exemplary methods described above in regard to FIG. 2, thereby yielding sensor structure 146 (e.g., sensor structure 30, as shown in FIG. 2).

FIG. 8 is a schematic cross-sectional side view of a third embodiment of the extendable sensor system before and after a laser cutting process. Shown in FIG. 8 are substrate 220, fabricated sensor structure 230, conductor/printed sensor ink 238, encapsulant layer 240, integrated circuits 242, laser cutting process 244, and sensor structure 246. Fabricated sensor structure 230, substrate 220, conductor/printed sensor ink 238, integrated circuits 242, and sensor structure 246 are all substantially similar to those described above in regard to FIG. 7. In the illustrated embodiment, encapsulant layer 240 is a dielectric overcoat that can also provide exterior surface protection to sensor structure 246. In some embodiments, substrate 220 provides sufficient mechanical support for sensor structure 246, and a mechanical support ink is not required (e.g., dielectric/mechanical support ink, as shown in FIG. 7). Accordingly, in these embodiments, conductor/printed sensor ink 238 can be deposited directly on substrate 220 which has a dielectric property. In these or other embodiments, encapsulant layer 246 can be a dielectric/mechanical support ink.

In the illustrated embodiment, fabricated sensor structure 230 includes a single layer of conductor/printed sensor ink 238. In other embodiments, two or more layers of conductor/printed sensor ink 238 can be used, each being sandwiched between alternating layers of encapsulant later 240, thereby providing two or more electrically-conductive strands in a particular interconnect (e.g., as described above in regard to FIG. 1).

Referring again to FIG. 8, laser cutting process 244 uses a laser beam for cutting (i.e., ablation) of sensor structure 246 (i.e., conductor/printed sensor ink 238, encapsulant layer 240, integrated circuits 242) from substrate 220. In a particular embodiment, laser cutting process 244 can use a pulsed femtosecond laser that provides an ultrashort pulse of high-energy light. A pulsed femtosecond laser can be useful in performing precision micro-machining of the various materials associated with sensor structure 246, while providing minimal impact on the surrounding materials (i.e., a heat-affected zone) because of the ultrashort laser pulse duration (i.e., close to or less than one femtosecond, $1\times10^{-15}$ sec.) In other embodiments, other lasers can be used for laser cutting process 244. Those who are skilled in the laser art are familiar with the various types of lasers that can be used for precision-machining of microelectronic components and associated materials.

Laser cutting process 244 can be referred to as a release process, because sensor structure 246 is released (i.e., cut away) from substrate 220. Accordingly, the resulting sensor structure 246 following the release process includes the portions of substrate 220 that are under the various electrically-conductive traces (i.e., conductor/printed sensor ink 238), but the remainder of substrate 220 is released from sensor structure 246. Laser cutting process 244 can also be referred to as a trimming process and as a precision micromachining process.

It is to be appreciated that chemical release process 144 described above in regard to FIG. 7 and laser cutting process 244 described above in regard to FIG. 8 are non-limiting exemplary processes that can be used to separate an expandable sensor structure from a substrate on which the expandable sensor structure was manufactured. All means of separating an expandable sensor structure from a removable substrate (or from portions of a removable substrate) are within the scope of the present disclosure.

Discussion of Possible Embodiments

An extendable sensor system having a lattice topology, comprising: a plurality of extendable interconnects comprising one or more electrically-conductive layers alternately sandwiched between two or more dielectric layers, wherein the extendable interconnects are configured to provide electrical connections to a sensor array; two or more interconnect nodes, each disposed on the lattice topology and electrically-connected to the extendable interconnects, thereby defining a sensor array topology; and one or more sensors; wherein: at least some of the plurality of extendable interconnects are arranged in a serpentine pattern that is configured to be expanded, thereby extending the extendable sensor system; the extended extendable sensor system defines an extended sensor system topology; and the extended sensor system topology is configured to be disposed on the surface of an asset.

The extendable sensor system of the preceding paragraph can optionally include, additionally and/or alternatively, any one or more of the following features, configurations and/or additional components:

A further embodiment of the foregoing extendable sensor system, wherein the extendable interconnects are flexible, thereby allowing the lattice topology to conform to an irregular surface profile.

A further embodiment of the foregoing extendable sensor system, wherein: a distance between two or more interconnect nodes defines an internodal distance; and the internodal distance can be expanded by a factor of 2 or more.

A further embodiment of the foregoing extendable sensor system, wherein the internodal distance can be expanded by a factor between 5-20.

A further embodiment of the foregoing extendable sensor system, further comprising one or more sensors, wherein: each of the one or more sensors is disposed on a corresponding interconnect node; and each of the one or more sensors is electrically connected to the sensor array topology.

A further embodiment of the foregoing extendable sensor system, wherein each of the one or more sensors is selected from the group consisting of thermocouple, resistance temperature detector (RTD), Wheatstone bridge, piezoelectric wafer, photocells, electrical resistance cell, electrical capacitance cell, and micro-electro-mechanical system (MEMS) cell.

A further embodiment of the foregoing extendable sensor system, wherein: at least one of the plurality of extendable interconnects defines an interconnect width and an interconnect thickness; a ratio of the interconnect width to the interconnect thickness defines an interconnect aspect ratio; and the interconnect aspect ratio is between 0.4-10.

A further embodiment of the foregoing extendable sensor system, wherein: each of the one or more electrically-conductive layers includes: a cured first material base; and an electrically-conductive material selected from the group consisting of: silver, copper, aluminum, gold, platinum, ruthenium, carbon, and alloys thereof; and each of the two or more dielectric layers includes a cured second material base.

A further embodiment of the foregoing extendable sensor system, further comprising a plurality of contact pads; wherein: the lattice topology defines a perimeter; the plurality of contact pads are disposed around the perimeter; and the plurality of contact pads are configured to provide an electrical connection to the extendable sensor system.

A method of manufacturing a substrate-free extendable sensor system, the method comprising: additively manufacturing, on a sacrificial substrate, the extendable sensor system by performing the steps of: (a) depositing a first dielectric layer defining a lattice topology, the first dielectric layer comprising a curable material; (b) depositing an electrically-conductive layer over the first dielectric layer, wherein: the electrically-conductive layer comprises a curable electrically-conductive material; the electrically-conductive layer is configured to provide electrical connections to a sensor array; and the electrically-conductive layer defines a pattern of interconnects; (c) depositing one or more sensors on the lattice topology, each of the one or more sensors being disposed at a point defined by an intersection of interconnects and electrically connected to the electrical connections; and (d) depositing a second dielectric layer over the electrically-conductive layer; and performing a release process, thereby releasing the extendable sensor system from the sacrificial substrate; wherein: the pattern of interconnects comprises a plurality of extendable interconnects; at least some of the plurality of extendable interconnects are arranged in a serpentine pattern that is configured to be expanded, thereby extending the extendable sensor system; the extended extendable sensor system defines an extended sensor system topology; and the extended sensor system topology is configured to be disposed on the surface of an asset.

The method of the preceding paragraph can optionally include, additionally and/or alternatively, any one or more of the following features, configurations and/or additional components:

A further embodiment of the foregoing method, wherein: depositing the first dielectric layer comprises the steps of: printing a layer of a curable first material; and curing the curable first material using light and/or heat; and depositing the electrically-conductive layer comprises the steps of: printing a layer of a curable second material; and curing the curable second material using light and/or heat.

A further embodiment of the foregoing method, wherein: depositing the first dielectric layer comprises aerosol jet (AJ) deposition, extrusion-based direct-write microdispensing, roll-to-roll (R2R) printing, gravure printing, screen printing, and/or thermal spray; and depositing the electrically-conductive layer comprises aerosol jet (AJ) deposition, extrusion-based direct-write microdispensing, roll-to-roll (R2R) printing, gravure printing, screen printing, cold spray, and/or thermal spray.

A further embodiment of the foregoing method, wherein the curable material comprises one or more of: thermoplastic, wherein the curing comprises cooling; and curable ink, wherein the curing comprises evaporation and/or sintering of a thermal solvent.

A further embodiment of the foregoing method, wherein the sensor is selected from the group consisting of thermocouple, resistance temperature detector (RTD), Wheatstone bridge, piezoelectric wafer, photocells, electrical resistance cell, electrical capacitance cell, and micro-electro-mechanical system (MEMS) cell.

A further embodiment of the foregoing method, wherein the electrically-conductive material comprises: a cured first material base; and an electrically-conductive material selected from the group consisting of: silver, copper, aluminum, gold, platinum, ruthenium, carbon, and alloys thereof.

A further embodiment of the foregoing method, wherein: a distance between two or more interconnect nodes defines an internodal distance; and the internodal distance can be expanded by a factor of 2 or more.

A further embodiment of the foregoing method, wherein the internodal distance can be expanded by a factor between 5-20.

A further embodiment of the foregoing method, wherein: the sacrificial substrate further comprises a chemically-dissolvable surface coating comprising polyvinyl alcohol, soluble acrylate, and/or polystyrene; the sacrificial substrate is chemically-dissolvable by a dissolvent; and the dissolvent comprises water, alcohol, limonene, and/or an alkali solution.

A further embodiment of the foregoing method, wherein additively manufacturing the extendable sensor system further comprises the steps of: (e) depositing a second electrically-conductive conductive layer over the second dielectric layer, wherein: the second electrically-conductive layer comprises the curable electrically-conductive material; the second electrically-conductive layer is configured to provide electrical connections to the sensor array; and the second electrically-conductive layer further defines the pattern of interconnects; and (f) depositing a third dielectric layer over the second electrically-conductive layer.

A method of manufacturing an extendable sensor system, the method comprising: additively manufacturing, on a substrate, the extendable sensor system by performing the steps of: (a) depositing, on the substrate, an electrically-conductive layer defining a lattice topology, wherein the electrically-conductive layer defines a pattern of interconnects; (b) depositing one or more sensors on the lattice topology, each of the one or more sensors being disposed at a point defined by an intersection of interconnects and electrically connected to the electrical connections; and (c) depositing a dielectric layer over the electrically-conductive layer; and performing a cutting process by precision machining using a femtosecond laser, thereby cutting the extendable sensor system from the substrate; wherein: the pattern of interconnects comprises a plurality of extendable interconnects; at least some of the plurality of extendable interconnects are arranged in a serpentine pattern that is configured to be expanded, thereby extending the extendable sensor system; the extended extendable sensor system defines an extended sensor system topology; and the extended sensor system topology is configured to be disposed on the surface of an asset.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An extendable sensor system having a lattice topology, comprising:
a plurality of extendable interconnects comprising one or more electrically-conductive layers alternately sandwiched between two or more dielectric layers, wherein the extendable interconnects are configured to provide electrical connections to a sensor array;
two or more interconnect nodes, each disposed on the lattice topology and electrically-connected to the extendable interconnects, thereby defining a sensor array topology;
a plurality of contact pads configured to provide an electrical connection to the extendable sensor system; and
one or more sensors;
wherein:
at least some of the plurality of extendable interconnects are arranged in a serpentine pattern that is configured to be expanded, thereby extending the extendable sensor system;
the extended extendable sensor system defines an extended sensor system topology; and
the extended sensor system topology is configured to be disposed on the surface of an asset.

2. The extendable sensor system of claim 1, wherein the extendable interconnects are flexible, thereby allowing the lattice topology to conform to an irregular surface profile.

3. The extendable sensor system of claim 1, wherein:
a distance between two or more interconnect nodes defines an internodal distance; and
the internodal distance can be expanded by a factor of 2 or more.

4. The extendable sensor system of claim 3, wherein the internodal distance can be expanded by a factor between 5-20.

5. The extendable sensor system of claim 1, further comprising one or more sensors, wherein:
each of the one or more sensors is disposed on a corresponding interconnect node; and
each of the one or more sensors is electrically connected to the sensor array topology.

6. The extendable sensor system of claim 5, wherein each of the one or more sensors is selected from the group consisting of thermocouple, resistance temperature detector (RTD), Wheatstone bridge, piezoelectric wafer, photocells, electrical resistance cell, electrical capacitance cell, and micro-electro-mechanical system (MEMS) cell.

7. The extendable sensor system of claim 1, wherein:
at least one of the plurality of extendable interconnects defines an interconnect width and an interconnect thickness;
a ratio of the interconnect width to the interconnect thickness defines an interconnect aspect ratio; and
the interconnect aspect ratio is between 0.4-10.

8. The extendable sensor system of claim 1, wherein:
each of the one or more electrically-conductive layers includes:
a cured first material base; and
an electrically-conductive material selected from the group consisting of: silver, copper, aluminum, gold, platinum, ruthenium, carbon, and alloys thereof; and
each of the two or more dielectric layers includes a cured second material base.

9. The extendable sensor system of claim 1, wherein:
the lattice topology defines a perimeter; and
the plurality of contact pads are disposed around the perimeter.

10. A method of manufacturing a substrate-free extendable sensor system, the method comprising:
additively manufacturing, on a sacrificial substrate, the extendable sensor system by performing the steps of:
(a) depositing a first dielectric layer defining a lattice topology, the first dielectric layer comprising a curable material;
(b) depositing an electrically-conductive layer over the first dielectric layer, wherein:
the electrically-conductive layer comprises a curable electrically-conductive material;
the electrically-conductive layer is configured to provide electrical connections to a sensor array; and
the electrically-conductive layer defines a pattern of interconnects;
(c) depositing one or more sensors on the lattice topology, each of the one or more sensors being disposed at a point defined by an intersection of interconnects and electrically connected to the electrical connections; and
(d) depositing a second dielectric layer over the electrically-conductive layer; and
performing a release process, thereby releasing the extendable sensor system from the sacrificial substrate;
wherein:
the pattern of interconnects comprises a plurality of extendable interconnects;
at least some of the plurality of extendable interconnects are arranged in a serpentine pattern that is configured to be expanded, thereby extending the extendable sensor system;
the extended extendable sensor system defines an extended sensor system topology; and
the extended sensor system topology is configured to be disposed on the surface of an asset.

11. The method of claim 10, wherein:
depositing the first dielectric layer comprises the steps of:
printing a layer of a curable first material; and
curing the curable first material using light and/or heat; and
depositing the electrically-conductive layer comprises the steps of:
printing a layer of a curable second material; and
curing the curable second material using light and/or heat.

12. The method of claim 10, wherein:
depositing the first dielectric layer comprises aerosol jet (AJ) deposition, extrusion-based direct-write microdispensing, roll-to-roll (R2R) printing, gravure printing, screen printing, and/or thermal spray; and
depositing the electrically-conductive layer comprises aerosol jet (AJ) deposition, extrusion-based direct-write microdispensing, roll-to-roll (R2R) printing, gravure printing, screen printing, cold spray, and/or thermal spray.

13. The method of claim 10, wherein the curable material comprises one or more of:
thermoplastic, wherein the curing comprises cooling; and
curable ink, wherein the curing comprises evaporation and/or sintering of a thermal solvent.

14. The method of claim 10, wherein the sensor is selected from the group consisting of thermocouple, resistance temperature detector (RTD), Wheatstone bridge, piezoelectric wafer, photocells, electrical resistance cell, electrical capacitance cell, and micro-electro-mechanical system (MEMS) cell.

15. The method of claim 10, wherein the electrically-conductive material comprises:
a cured first material base; and
an electrically-conductive material selected from the group consisting of: silver, copper, aluminum, gold, platinum, ruthenium, carbon, and alloys thereof.

16. The method of claim 10, wherein:
a distance between two or more interconnect nodes defines an internodal distance; and
the internodal distance can be expanded by a factor of 2 or more.

17. The method of claim 16, wherein the internodal distance can be expanded by a factor between 5-20.

18. The method of claim 10, wherein:
the sacrificial substrate further comprises a chemically-dissolvable surface coating comprising polyvinyl alcohol, soluble acrylate, and/or polystyrene;
the sacrificial substrate is chemically-dissolvable by a dissolvent; and
the dissolvent comprises water, alcohol, limonene, and/or an alkali solution.

19. The method of claim 10, wherein additively manufacturing the extendable sensor system further comprises the steps of:
(e) depositing a second electrically-conductive layer over the second dielectric layer, wherein:
the second electrically-conductive layer comprises the curable electrically-conductive material;
the second electrically-conductive layer is configured to provide electrical connections to the sensor array; and
the second electrically-conductive layer further defines the pattern of interconnects; and
(f) depositing a third dielectric layer over the second electrically-conductive layer.

20. A method of manufacturing an extendable sensor system, the method comprising:
additively manufacturing, on a substrate, the extendable sensor system by performing the steps of:
(a) depositing, on the substrate, an electrically-conductive layer defining a lattice topology, wherein the electrically-conductive layer defines a pattern of interconnects;
(b) depositing one or more sensors on the lattice topology, each of the one or more sensors being disposed at a point defined by an intersection of interconnects and electrically connected to the electrical connections; and
(c) depositing a dielectric layer over the electrically-conductive layer; and
performing a cutting process by precision machining using a femtosecond laser, thereby cutting the extendable sensor system from the substrate;

wherein:
the pattern of interconnects comprises a plurality of extendable interconnects;
at least some of the plurality of extendable interconnects are arranged in a serpentine pattern that is configured to be expanded, thereby extending the extendable sensor system;
the extended extendable sensor system defines an extended sensor system topology; and
the extended sensor system topology is configured to be disposed on the surface of an asset.

* * * * *